US009547230B2

(12) United States Patent
Mikami et al.

(10) Patent No.: US 9,547,230 B2
(45) Date of Patent: Jan. 17, 2017

(54) METHOD FOR EVALUATING OPTICAL IMAGE OF PATTERN, RECORDING MEDIUM, AND INFORMATION PROCESSING APPARATUS (71) Applicant: CANON KABUSHIKI KAISHA, Tokyo (JP)

(72) Inventors: Koji Mikami, Nikko (JP); Tadashi Arai, Saitama (JP)

(73) Assignee: CANON KABUSHIKI KAISHA, Tokyo (JP)

(*) Notice: Subject to any disclaimer, the term of this patent is extended or adjusted under 35 U.S.C. 154(b) by 83 days.

(21) Appl. No.: 14/572,651

(22) Filed: Dec. 16, 2014

(65) Prior Publication Data
US 2015/0177609 A1 Jun. 25, 2015

(30) Foreign Application Priority Data

Dec. 25, 2013 (JP) ................. 2013-267159

(51) Int. Cl.
G06F 17/50 (2006.01)
G03F 1/36 (2012.01)
(52) U.S. Cl.
CPC ..................... G03F 1/36 (2013.01)

(58) Field of Classification Search
CPC ........ G03F 1/36; G03F 7/70441; G03F 7/705; G03F 7/70433; G06F 17/5081; G06F 2217/12; H01L 21/31144; H01L 21/266; H01L 21/32139
USPC ................... 716/50–55; 430/5, 30
See application file for complete search history.

(56) References Cited

U.S. PATENT DOCUMENTS

| 7,886,243 B1 | 2/2011 | Gumaste | |
|---|---|---|---|
| 2003/0162105 A1* | 8/2003 | Nojima | G03F 1/84 430/5 |
| 2008/0003510 A1* | 1/2008 | Harazaki | G03F 1/144 430/5 |
| 2011/0177457 A1* | 7/2011 | Maeda | G03F 1/36 430/319 |

* cited by examiner

Primary Examiner — Nghia Doan
(74) Attorney, Agent, or Firm — Canon USA, Inc. IP Division (57) ABSTRACT A method being performed by a processor includes, acquiring data of patterns of a plurality of cells that include an identified pattern for which an evaluation value of an optical image falls outside a first allowable range among patterns in which each a pattern being single cell alone, creating the pattern of a mask by arranging the patterns of the plurality of cells that include the identified pattern, and evaluating an optical image of the identified pattern in the created pattern of the mask.

17 Claims, 9 Drawing Sheets

| CELL | MINIMUM VALUE OF DEPTH OF FOCUS |
|---|---|
| A | 38.3 |
| B | 36.8 |
| C | 46.9 |
| D | 49.3 |
| E | 47.5 |
| F | 32.0 |
| G | 43.3 |
| H | 48.2 |
| I | 42.2 |
| J | 48.8 |
| K | 48.2 |
| L | 48.6 |
| M | 42.7 |
| N | 40.9 |
| O | 43.0 |

CELL A

FIG. 6B

CELL F

METHOD FOR EVALUATING OPTICAL IMAGE OF PATTERN, RECORDING MEDIUM, AND INFORMATION PROCESSING APPARATUS

BACKGROUND OF THE INVENTION

Field of the Invention

The present invention relates to a method for evaluating an optical image of a pattern, a recording medium, and an information processing apparatus.

Description of the Related Art

An exposure apparatus is used in an exposure process during a process for manufacturing a semiconductor device. The exposure apparatus illuminates a mask (reticle) with a circuit pattern of the semiconductor device formed thereon by an illumination optical system using light from a light source, and transfers the pattern of the mask onto a wafer via a projection optical system or the like.

In recent years, further miniaturization of the pattern of the semiconductor device has been advancing, and a super-resolution technique, such as Off-Axis Illumination of the illumination optical system and an optical proximity effect correction (OPC) of the pattern of the mask, has started to be used in the exposure process.

The pattern corrected by the OPC is input into an optical image simulator, and an optical image of the pattern is calculated and then evaluated to confirm that this OPC has a desired correction effect. This is called lithography verification. The lithography verification can be carried out while the OPC is being performed or after the OPC is completed to determine whether a result of the correction is sufficiently excellent. When this lithography verification is carried out over an entire surface of a device chip (an entire surface of the mask), several days may be spent as a processing time, and it takes an enormous calculation time, since a data amount of the pattern is massive. Further, the miniaturization of the pattern has led to a further increase in the data amount of the pattern, and thus an increase in the time required for the lithography verification according thereto.

There is known a technique that conducts a rule-based check over an entire surface of a chip according to geometric design rules in advance, determines a pattern difficult to be resolved, and carries out the lithography verification on a region limited based on a result of this determination (U.S. Pat. No. 7,886,243).

The lithography verification discussed in U.S. Pat. No. 7,886,243 can reduce a region for which an optical image of a pattern is evaluated, and therefore can bring about a certain effect in a reduction in the calculation processing time. However, since this technique checks the entire surface of the mask according to the geometric design rules before the lithography verification, it takes a while to determine a critical pattern (a lithography hotspot). Further, a determination about a complicated graphic uses the geometric design rules therefor to also become complicated, which raises such a possibility that an oversight may occur in extraction of the critical pattern. This possibility cannot be ignored.

SUMMARY OF THE INVENTION

According to an aspect of the present invention, a method performed by a processor includes, acquiring data of patterns of a plurality of cells that include an identified pattern for which an evaluation value of an optical image falls outside a first allowable range among patterns in which each a pattern being a single cell alone, creating the pattern of a mask by arranging the patterns of the plurality of cells that include the identified pattern, and evaluating an optical image of the identified pattern in the created pattern of the mask.

Further features of the present invention will become apparent from the following description of exemplary embodiments with reference to the attached drawings.

DESCRIPTION OF THE EMBODIMENTS

In the following description, exemplary embodiments of the present invention will be described in detail with reference to the accompanying drawings.

The exemplary embodiments of the present invention can be applied to evaluate an optical image of a pattern of a mask (a master mask) used during manufacturing of various kinds of devices, for example, a semiconductor chip such as an integrated circuit (IC) and a large-scale integration (LSI), a display element such as a liquid crystal panel, a detection element such as a magnetic head, and an image sensor such as a charge coupled device (CCD), and used in micromechanics.

Figure 1:
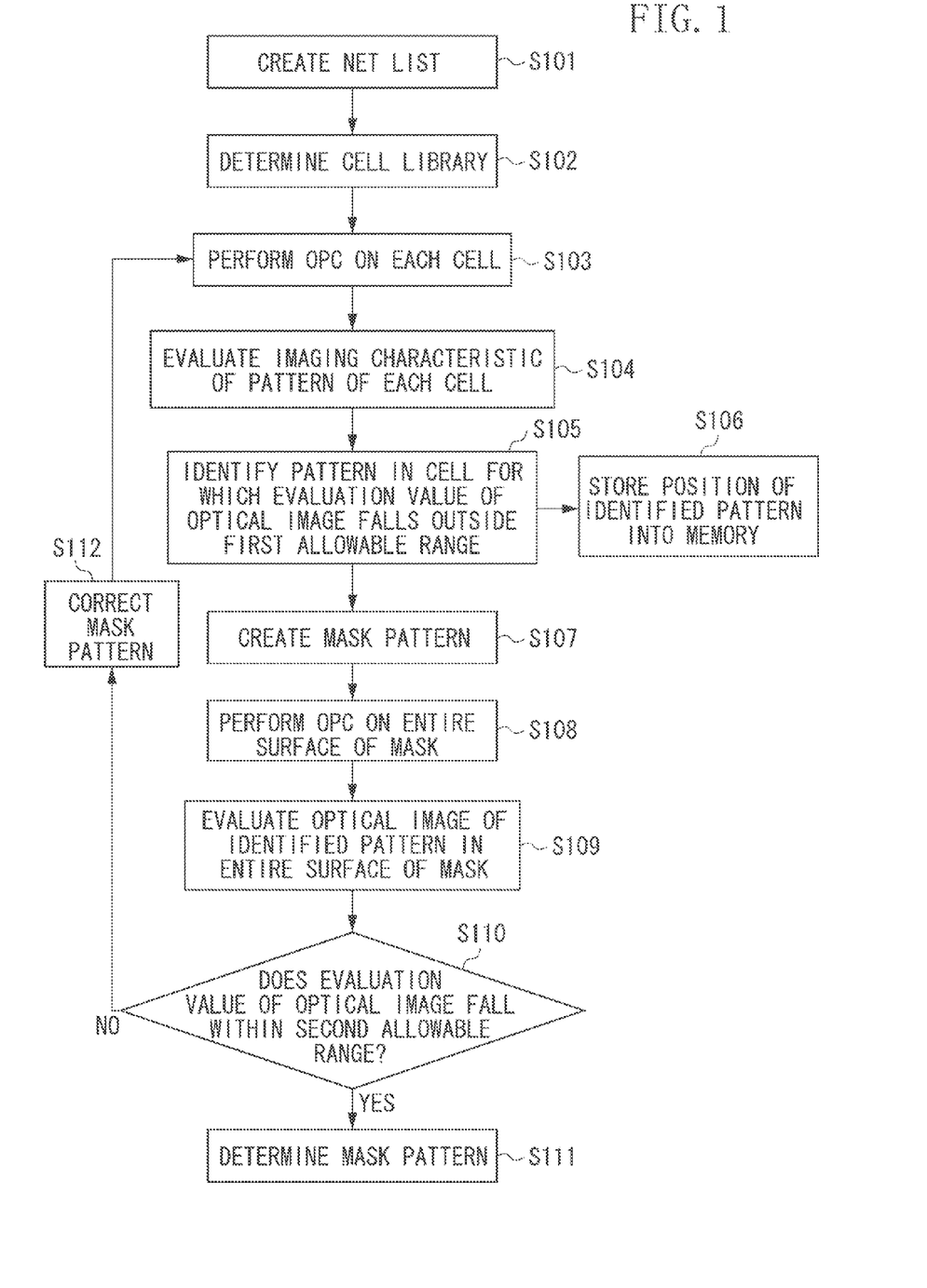
FIG. 1 is a flowchart illustrating a method for evaluating an optical image of a pattern.

A method for evaluating an optical image of a pattern according to the exemplary embodiments of the present invention will be described. FIG. 1 is a flowchart illustrating the method for evaluating an optical image of a pattern according to the exemplary embodiments of the present invention. The method according to the exemplary embodiments of the present invention is realized by, for example, supplying a program capable of performing respective steps illustrated in FIG. 1 to an information processing apparatus (a computer) via a network or a recording medium, and causing the information processing apparatus to read out the program stored in a storage medium such as a memory to execute the program. This method is used to evaluate an optical image of a pattern of a mask for use in an exposure apparatus that transfers this mask pattern onto a substrate by an exposure. The exposure apparatus to which this method can be applied is not limited to an exposure apparatus that illuminates the mask and projects an image of the pattern of the mask onto the substrate using a projection optical system. This method can also be applied to a near-field exposure apparatus, and an exposure apparatus that exposes the substrate using an electron beam. For the electron beam exposure apparatus, this method is used to evaluate a pattern formed on the substrate when the substrate is exposed using data of the pattern transferred to the electron beam exposure apparatus.

An integrated circuit of a semiconductor logic chip is designed through a series of complicated conversions from a flow of an electric signal to a layout of a mask. Currently, an automatic software tool (a simulator) is used in most of these design conversions.

First, in step S101, the computer creates the flow of the electric signal (a net list). Subsequently, in step S102, the computer determines a cell library, which is a collection of elements for realizing functions constructed on the net list. The library contains cells having various circuit scales, and the contained cells range from a standard cell such as a Negated AND (NAND) gate and a flip-flop to a macrocell such as a random access memory (RAM), a read only memory (ROM), and a central processing unit (CPU) core. The macrocell is also often constituted by a combination of standard cell patterns.

The cell contains layout information, and information such as data indicating an electric characteristic. The method according to the exemplary embodiments of the present invention will be described, assuming that the standard cell used in the exemplary embodiments of the present invention is a cell patterned according to a one-dimensional Gridded Design layout as a representative example. However, the method according to the exemplary embodiments of the present invention is not limited thereby, and can be also applied to another pattern than a rectangle, such as a pattern according to a two-dimensional layout. The one-dimensional layout technique will be described below. Due to, for example, a reduction in the factor $k_1$, it has been becoming difficult to transfer a desired pattern onto a wafer with high fidelity using the conventional two-dimensional layout pattern (that extends in vertical and horizontal directions). Therefore, in recent years, a method for manufacturing a circuit pattern that is called the one-dimensional layout technique has been contrived. According to the one-dimensional layout technique, a line and space (L/S) pattern based on a single pitch is formed. After that, a plurality of rectangular pattern elements such as a cut pattern, which has equal image dimensions, is transferred onto a same grid at a plurality of positions by an exposure. In this manner, a circuit pattern is fabricated by cutting the L/S pattern based on a single pitch, which is formed on the substrate in advance, by the plurality of pattern elements, and connecting space portions. This method can not only reduce an exposed area compared to the conventional two-dimensional pattern, but also increase an exposure latitude and make resolution of the pattern technically easier.

Subsequently, in step S103, the computer performs an OPC on a pattern of each of the cells in the cell library. In this example, a model-based OPC will be described. First, the computer sets each single one of the standard cells configured according to design values as a target, and calculates an optical image of the target by conducting a simulation. If the exposure apparatus is the projection exposure apparatus, the computer calculates an optical image on an image plane when the single cell alone would be placed on a mask surface and illuminated under a predetermined illumination condition, and then the pattern of the illuminated cell would be projected on the substrate (the image plane) using the projection optical system. In step S103, the computer performs the OPC (optical proximity effect correction) on the pattern of the cell in such a manner that the calculated optical image approaches a target dimension. The example using the model-based OPC has been described here, but the OPC performed at this time may be a rule-based OPC. Further, the OPC may be omitted for such a reason that an exposure margin can be sufficiently secured, or another reason.

In step S104, the computer evaluates an imaging characteristic of the cell pattern corrected by the OPC in step S103. If the exposure apparatus is the projection exposure apparatus, the computer calculates an optical image on the image plane when the cell pattern corrected by the OPC in step S103 would be placed on the mask surface and illuminated under the predetermined illumination condition, and then the illuminated cell pattern would be projected on the image plane using the projection optical system. Then, the computer evaluates the optical image according to a predetermined evaluation index, and calculates an evaluation value as the imaging characteristic. The optical image can be calculated according to a known imaging theory or an optical model using an optical simulator. Examples of the evaluation index include the exposure latitude, a normalized image long-slope (NILS), and a depth of focus (DOF) of the optical image. An exposure condition employed in steps S103 and 104, such as an exposure wavelength of the exposure apparatus, the condition for the illumination of the mask, and a numerical aperture (NA) of the projection optical system, had better being set to become similar or close to an exposure condition that will be employed when a pattern on the entire surface of the mask (chip) is subjected to the exposure process by the exposure apparatus.

Subsequently, in step S105, the computer identifies a pattern in the cell for which the evaluation value of the optical image falls outside a first allowable range, based on the evaluation value of the optical image obtained in step S104. When the pattern is actually formed on the substrate, a defective chip is manufactured due to various causes such as a performance of a process apparatus that performs predetermined processing on the substrate, and deformation of the substrate, in addition to a cause relating to the exposure apparatus. An allowable value for the imaging characteristic when the entire surface of the mask is subjected to the exposure process by the exposure apparatus is predetermined to prevent a yield rate from decreasing due to these causes.

Figure 2:
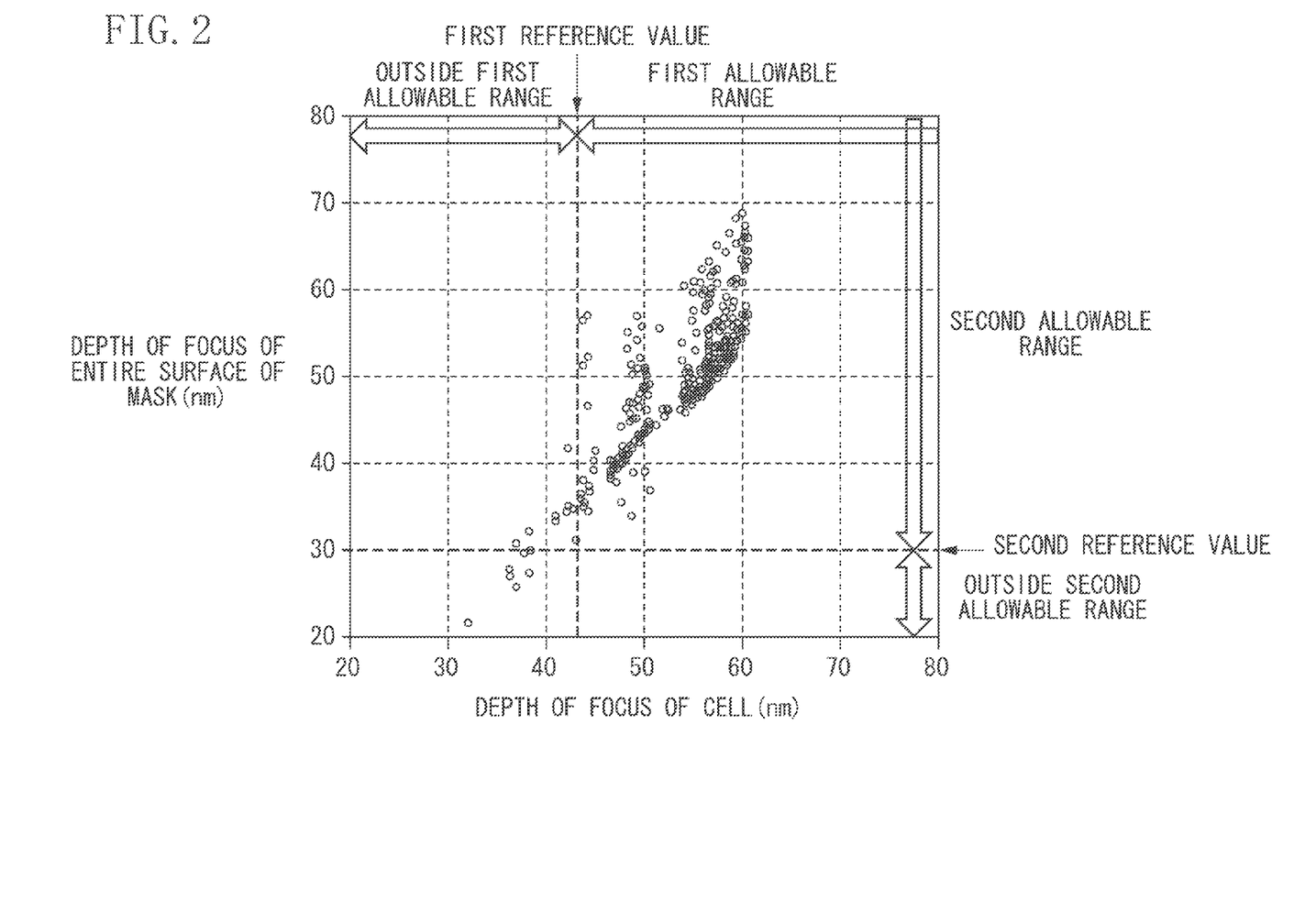
FIG. 2 illustrates a relationship between an imaging characteristic of a single cell alone, and an imaging characteristic of an entire surface of a mask.

FIG. 2 illustrates a relationship between an imaging characteristic of the entire surface of the mask by the lithography verification, and the imaging characteristic of the single cell alone for each pattern. The imaging characteristic of the single cell alone before the cell is mounted on the mask, and the imaging characteristic after the cell is mounted on the mask are plotted as white circles for each cell. A vertical axis represents a value of the imaging characteristic at each of a plurality of points in the mask formed by arranging a plurality of cells. A horizontal axis represents the cell imaging characteristic of the pattern of the single cell alone for a plurality of cells different from one another. The depth of focus is used as the imaging characteristic. FIG. 2 reveals that the imaging characteristic of the cell and the imaging characteristic of the entire surface of the mask are positively correlated with each other, although there is a variation. Therefore, an allowable range for the imaging characteristic of the single cell alone can be determined from an allowable range for the imaging characteristic of the entire surface of the mask.

Generally, since the imaging characteristic of the entire surface of the mask formed by arranging a plurality of cells is changed by an extremely small amount from the imaging characteristic of the single cell alone before the cell is mounted on the mask, a range that can satisfy a process requirement even when a change occurs is set as the allowable range for the cell imaging characteristic. For example, as illustrated in FIG. 2, assuming that 30 nm is set as a second reference value of the imaging characteristic of the entire surface of the mask, 43.5 nm is set as a first reference value of the imaging characteristic of the cell. A range over the second reference value is set as a second allowable range (30 nm and greater), and a range over the first reference value is set as a first allowable range (43.5 nm and greater). If a pattern corresponds to a cell imaging characteristic falling outside the first allowable range, a mask imaging characteristic thereof when the cell is mounted on the mask may fail to satisfy the second allowable range. Hereinafter, such a pattern will be referred to as a critical pattern (a lithography hotspot), and a cell containing the critical pattern will be referred to as a critical cell. The first allowable range of the cell imaging characteristic based on which the critical pattern is extracted is narrower than the second allowable range of the imaging characteristic of the entire surface of the mask. In other words, the first reference value is larger than the second reference value.

In step S105, the computer identifies the critical pattern (an identified pattern) for which the evaluation value of the optical image calculated in step S104 falls outside the first allowable range. In step S106, the computer stores a position (coordinates) of the identified critical pattern in the cell into a storage unit such as a memory. Further, the computer can also store information about coordinates at which the cell containing the critical pattern is placed in the pattern of the mask to be created, into the memory.

Subsequently, in step S107, the computer creates the pattern of the mask using the cell patterns corrected by the OPC and the net list. First, the computer obtains data of patterns of a plurality of cells that include the critical pattern identified in step S105. Then, the computer converts the obtained data into a physical layout of a circuit using the patterns of the cells and the net list. An automatic placement and routing tool is used for converting the data into the layout. Generally, the data of the cells includes all polygons on all layers, which are required to manufacture a device including the cells. A commonly-used format for the layout is Graphic Database System II (GDSII) or Open Artwork System Interchange Standard (OASIS). Physical layout data over the entire surface of the mask is created, and the pattern of the mask is created by the automatic placement and routing tool.

After the pattern of the mask is created, the design is verified to confirm that the net list is appropriately converted into the layout, and the created final layout unfailingly complies with a specific geometric design rule. If an abnormality or an error is found out by a design verification tool, a designer should correct a defective portion before the layout is sent to a mask manufacturing factory to manufacture the mask. Further, a layout verification simulation is carried out to predict a manufacturing distortion that may occur during lithography patterning. If the magnitudes of these errors are determined to be significant, corrections are made using some form of Optical and Process Correction (OPC). The OPC can correct an image distortion, an optical proximity effect, a photoresist kinetic effect, an etch loading distortion, and other various process effects.

Subsequently, in step S108, the computer performs the OPC processing on the created pattern of the mask. The computer corrects the shape of the pattern of the mask in such a manner that an optical image of the pattern of the mask approaches a target value. At this time, generally, the correction is made using a model in consideration of the influence of an exposure, development, etching, and the like relating to wafer process processing. This correction may be omitted, if disposing the cells corrected by the OPC in step S103 allows a sufficient margin to be obtained at the time of the lithography verification even without the OPC processing performed on the entire surface of the chip.

Subsequently, in step S109, the computer carries out the lithography verification for evaluating an optical image of the pattern identified in step S105, in the entire surface of the mask. First, the computer extracts a portion to be verified by the lithography verification based on the information about the critical pattern and the critical cell identified in step S105 and stored in the memory. The coordinates at which the critical cell is placed in the pattern layout of the entire surface of the chip can be clarified from layout design information using the placement and routing tool. Further, the coordinates of the critical pattern in the critical cell are also clarified from the information stored in the memory. The computer extracts a portion to be verified by the lithography verification from these coordinate information pieces. More specifically, if the influence of the proximity effect of the pattern cannot be ignored, the computer sets a region to be calculated by the optical simulator in such a manner that the optical simulator can calculate a portion even including a region of K·λ/NA (K is a constant, λ is the exposure wavelength, and NA is the numerical aperture on a projection side of the projection optical system) surrounding the critical pattern. In other words, the lithography verification does not have to be carried out for a region in the entire surface of the mask that is not a critical pattern. Since the imaging characteristic of the single cell alone satisfies the first allowable range in the region that is not a critical pattern, this region highly likely satisfies the second allowable range, which is wider than the first allowable range, when the cell is mounted on the mask. Therefore, even omitting the lithography verification for the region that is not a critical pattern does not adversely affect evaluation of the imaging characteristic of the mask. In this manner, according to the exemplary embodiments of the present invention, the lithography verification is omitted for the region that is not a critical pattern, whereby it is possible to efficiently carry out the lithography verification on only the critical cell and the critical pattern, thereby succeeding in reducing a calculation time.

Subsequently, in step S110, the computer determines whether an evaluation value of the optical image of the critical pattern, which is calculated in step S109, falls within the second allowable range. If the evaluation value of the optical image falls within the second allowable range with respect to all critical patterns (YES in step S110), in step S111, the computer determines this pattern as a final pattern of the mask, and creates the pattern of the mask. If there is any critical pattern for which the evaluation value of the optical image falls outside the second allowable range (NO in step S110), in step S112, the computer performs a pattern correction so as to improve the imaging characteristic of this critical pattern. As the pattern correction, the computer can change the shape of the pattern, change the position of the pattern, add an auxiliary pattern, change the position of the cell in the mask, and/or make replacement. Then, the computer repeats steps S103 to S110 for the corrected pattern.

Next, specific exemplary embodiments will be described below.

Figure 3:
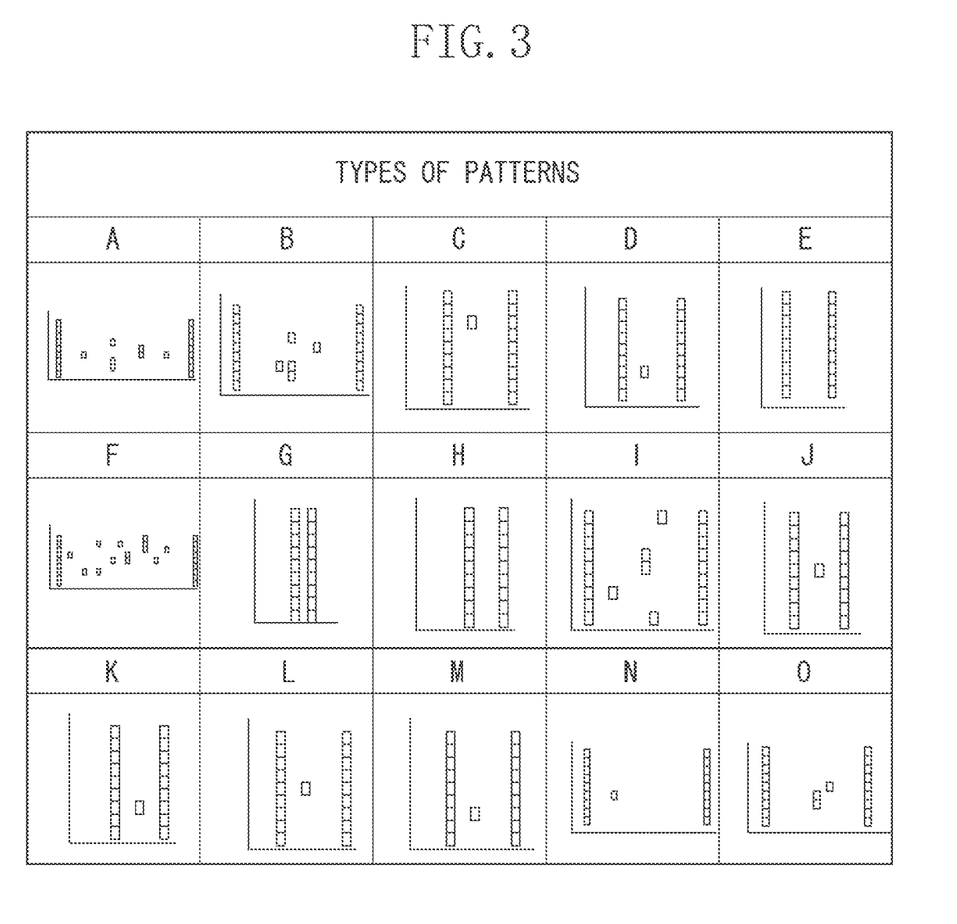
FIG. 3 illustrates examples of patterns of cells.

First, a first exemplary embodiment of the present invention will be described. FIG. 3 illustrates a library containing standard cells patterned according to the Gridded Design. FIG. 3 illustrates cut patterns for use in a cut process for cutting a desired portion in a preformed Line pattern by way of example. Each cut pattern includes a plurality of rectangular pattern elements. Normally, there are several hundred different types of patterns. However, in the present example, in step S102, the computer sets fifteen cells A to O for simplification of the description. Further, a design dimension of one cut pattern element is 64 nm on a vertical side and 41 nm on a horizontal side. A pitch of a grid in a vertical direction is 64 nm, and a pitch of the grid in a horizontal direction is 82 nm. The cells are arranged in such a manner that the cells are not affected by the cell proximity effect from one another with a space of approximately 3 um formed at a boundary between the cells. A line width and coordinates of a central position are set as variables of each of the cut patterns of the standard cells. An annular illumination is employed as an illumination (a light intensity distribution on a pupil plane of an illumination optical system) for use in an exposure of the pattern of the standard cell, and an external σ and an annular ratio (an external σ/an internal σ) are set as variables of this illumination.

A root mean square (RMS) of a line width error of each pattern element, and a NILS of each pattern element are set as evaluation targets of the image of the pattern. Further, a depth of focus F in which the exposure latitude (EL) satisfies 5% for a dimension CDx of an X cross-section including a center of a design value of each pattern element and a dimension CDy of a Y cross-section including the center of the design value of each pattern element is also set as an evaluation target. Furthermore, a positional shift error RGx and a positional shift error RGy of each pattern element are also set as evaluation targets. In the present exemplary embodiment, the following expression, an expression (1) is used as an evaluation index (an evaluation function) P, since it may be desirable to minimize the line width error and the positional shift errors of the pattern element while maximizing the NILS and the depth of focus of the pattern element. An RMS value of a sum of all evaluation points of images of patterns of a plurality of cells is set as a term of the evaluation function P with respect to the line width error. A worst value (a minimum value) among all evaluation points of the images of the patterns of the plurality of cells is set as a term of the evaluation function P with respect to each of the NILS, the positional shift errors, and the depth of focus.

$$P = \text{RMS OF LINE WIDTH ERROR/ALLOEABLE VALUE OF RMS OF LINE WIDTH ERROR} + \text{ALLOWABLE VALUE OF NILS/(MINIMUM VALUE OF NILS}+0.001) + \text{MINIMUM VALUE OF POSITIONAL SHIFT ERROR } RGx, RGy/\text{ALLOWABLE VALUE OF POSITIONAL SHIFT ERROR} + \text{ALLOWABLE VALUE OF DEPTH OF FOCUS/(MINIMUM VALUE OF DEPTH OF FOCUS } F+0.001) \quad (1)$$

In this expression, the allowable value of the RMS of the line width error is 1% of a target line width, the allowable value of the NILS is 1.5, the allowable value of the positional shift error is 5 nm, and the allowable value of the depth of focus is 70 nm.

As a result, an exposure condition is determined to be an annular illumination corresponding to an NA of 1.35, an external σ of 0.85, and an annular ratio of 0.5, and this exposure condition is used in the evaluation of the cell imaging characteristic, and the evaluation of the imaging characteristic of the entire surface of the mask. The patterns of the standard cells and the shape of the illumination are optimized at the same time, but they do not have to be optimized. A predetermined exposure condition when the entire surface of the mask is subjected to the exposure process may be used as the exposure condition.

Further, in step S103, the computer performs the OPC on the cut pattern of each of the cells, and calculates a bias amount and a shift amount of the cut pattern of each of the cells. For a cell that can provide a sufficient exposure margin, this cell may be maintained according to the design value without the OPC performed thereon.

Figure 4A:
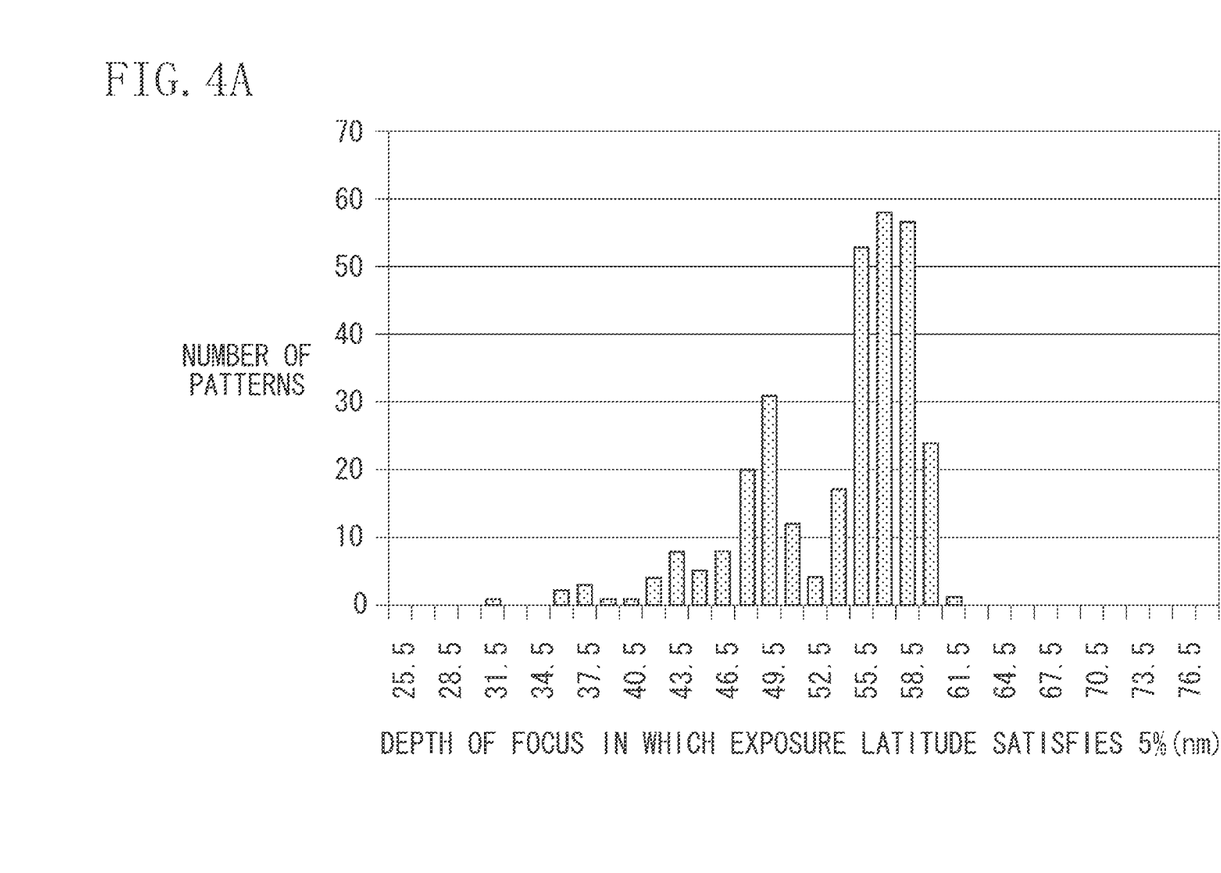
FIGS. 4A, 4B, and 4C illustrate the imaging characteristic of the single cell alone.
Figure 4B:
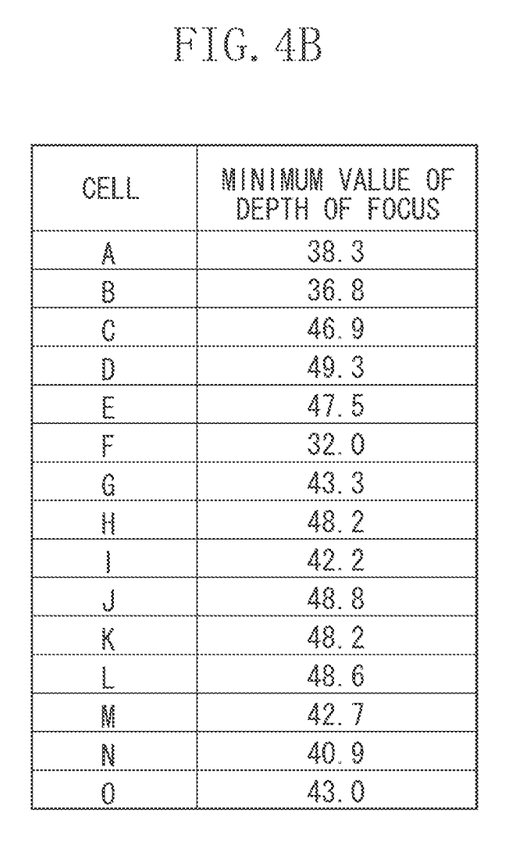

Subsequently, in step S104, the computer evaluates the imaging characteristic of the single cell alone for the pattern of each of the cells using the established exposure condition and the standard cell. The depth of focus in which the exposure latitude satisfies 5% is set as the evaluation index. FIG. 4A illustrates a distribution of the patterns according to the depth of focus in which the exposure latitude satisfies 5%. A horizontal axis represents an evaluation amount, and a vertical axis represents the number of cut patterns. Further, FIG. 4B indicates a minimum value of the depth of focus in which the exposure latitude satisfies 5%, for each cell. In step S105, the computer determines a critical cell and a critical pattern based on the allowable range of the cell imaging characteristic.

Figure 4C:
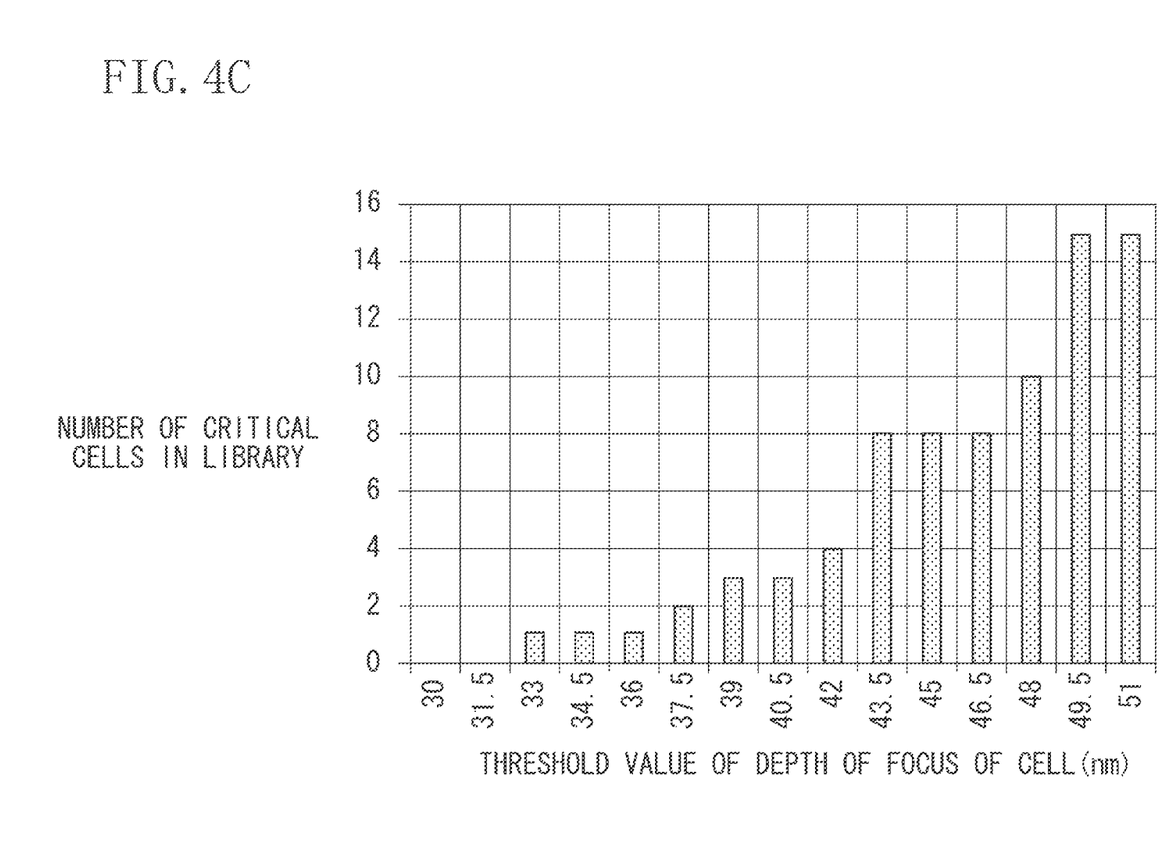
Figure 5A:
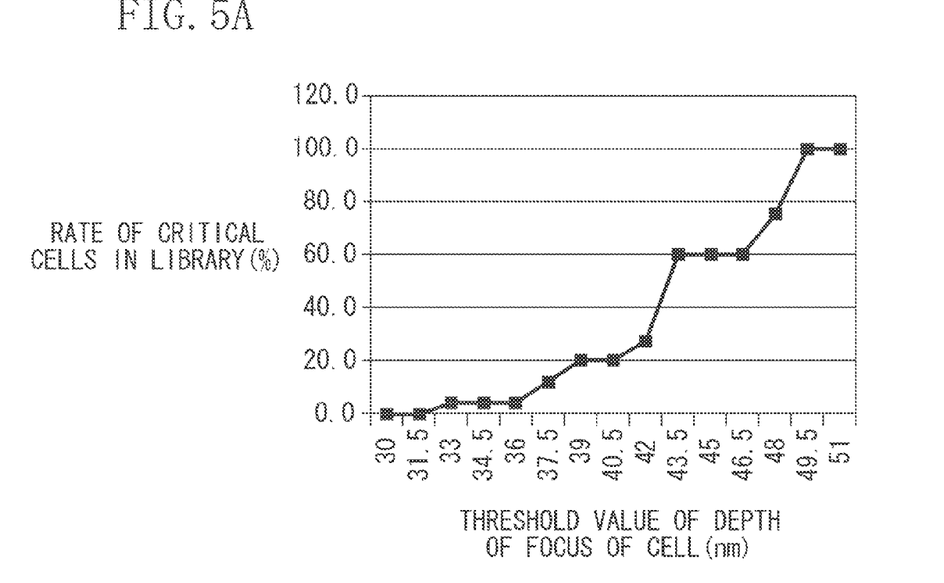
FIGS. 5A and 5B illustrate rates of critical cells and critical patterns in a library, respectively.
Figure 5B:
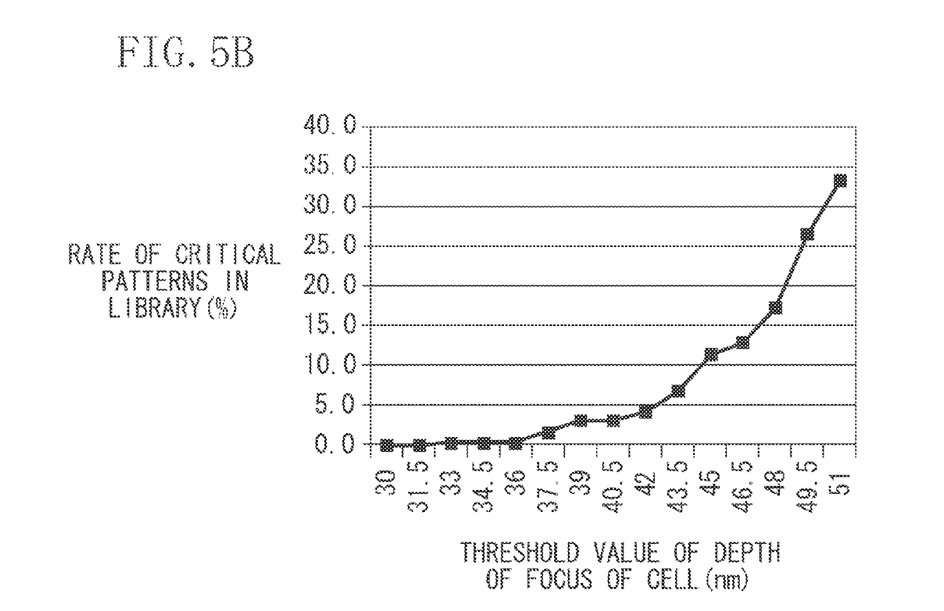
Figure 6A:
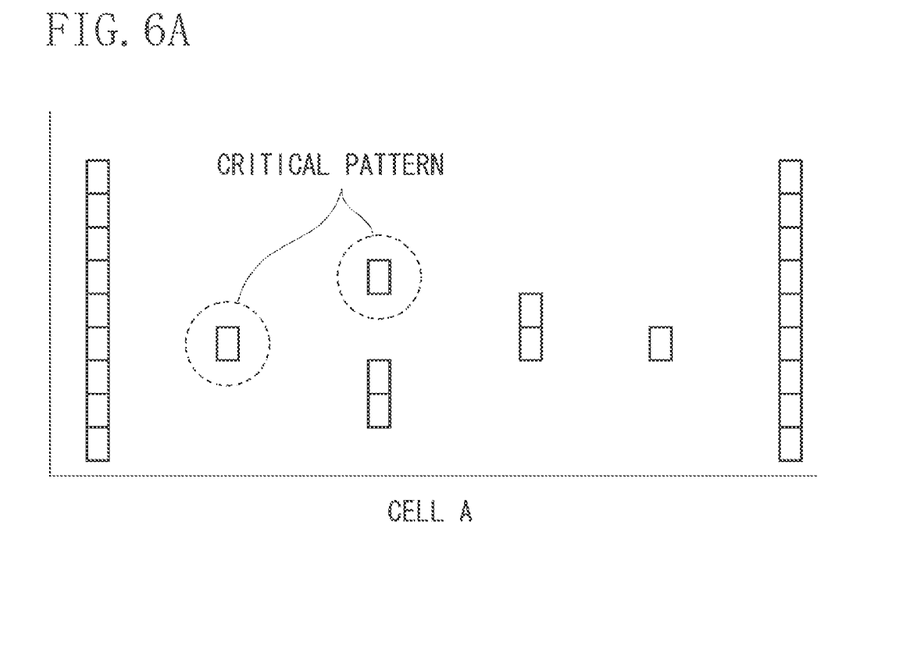
FIGS. 6A and 6B illustrate critical patterns in cells A and F, respectively.
Figure 6B:
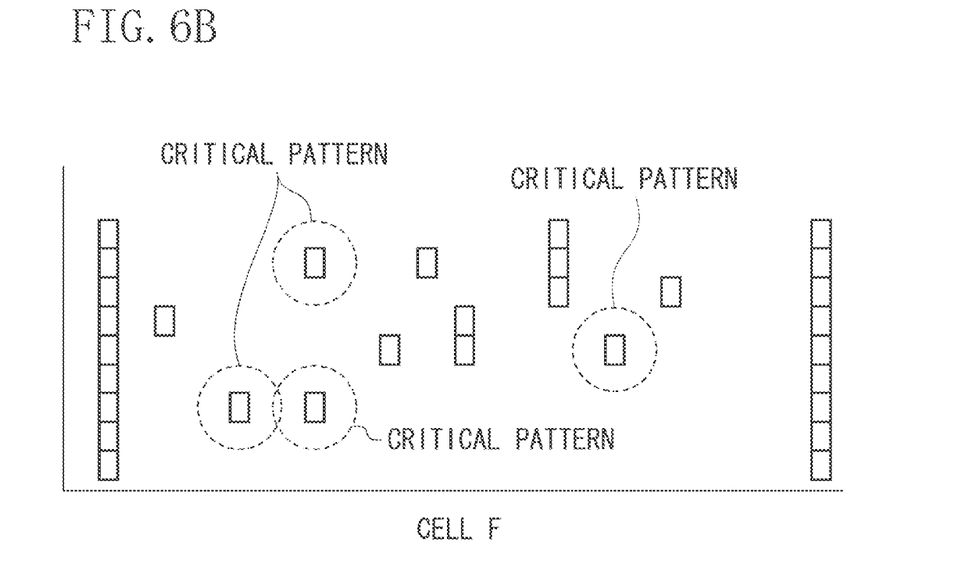

FIG. 4C indicates the numbers of critical cells when a threshold value (the first reference value) of the depth of focus for determining that a cell is a critical cell is changed. A horizontal axis represents the threshold value, and a vertical axis represents the number of critical cells that should be extracted. FIG. 5A indicates a rate of critical cells in the mask with respect to the threshold value (the first reference value) of the depth of focus. A horizontal axis represents the threshold value, and a vertical axis represents the rate of critical cells contained in the cell library. As described above, the first reference value of the imaging characteristic of the cell (the evaluation value of the optical image) is set to 43.5 nm, and the first allowable range is set to the range of 43.5 nm and greater. FIG. 5A reveals that the critical cells account for 60% of the all cells, when the threshold value is set to 43.5 nm. Cells of the remaining 40% clear the first reference value of the evaluation, so that the detailed lithography verification can be omitted for them. FIG. 5B indicates a rate of critical patterns in the cell library with respect to the threshold value (the first reference value) of the depth of focus. A horizontal axis represents the threshold value, and a vertical axis represents the rate of critical patterns in the cell library. The critical patterns account for 7% of the total number of patterns, when the threshold value is set to 43.5 nm. Patterns of the remaining 93% clear the allowable value of the evaluation, so that the detailed lithography verification can be omitted for them. FIG. 6A illustrates examples of critical patterns in the cell A, which is identified as a critical cell. FIG. 6B illustrates examples of critical patterns in the cell F, which is identified as a critical cell. Pattern elements surrounded by circular dotted lines are the critical patterns. The cell A and the cell F contain critical patterns different from each other.

Figure 7A:
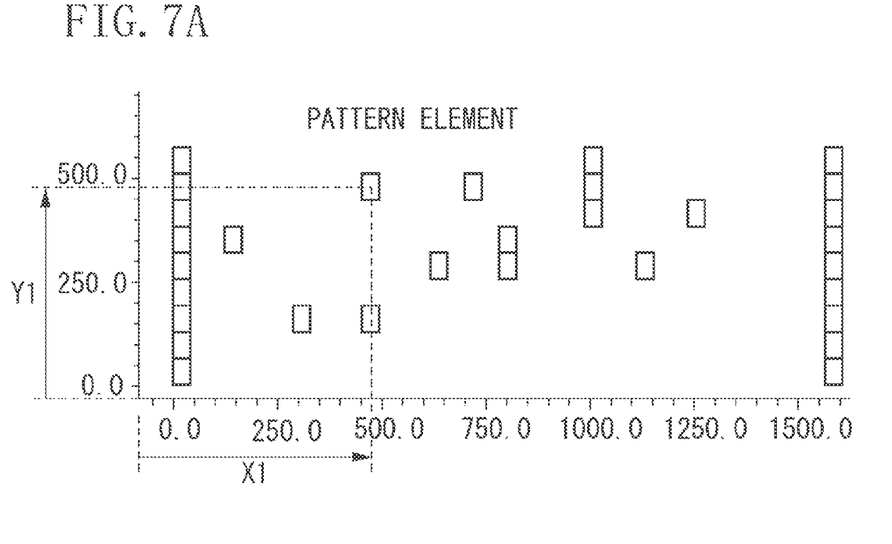
FIGS. 7A and 7B illustrate a mask pattern in which a plurality of cells is adjacently arranged.
Figure 7B:
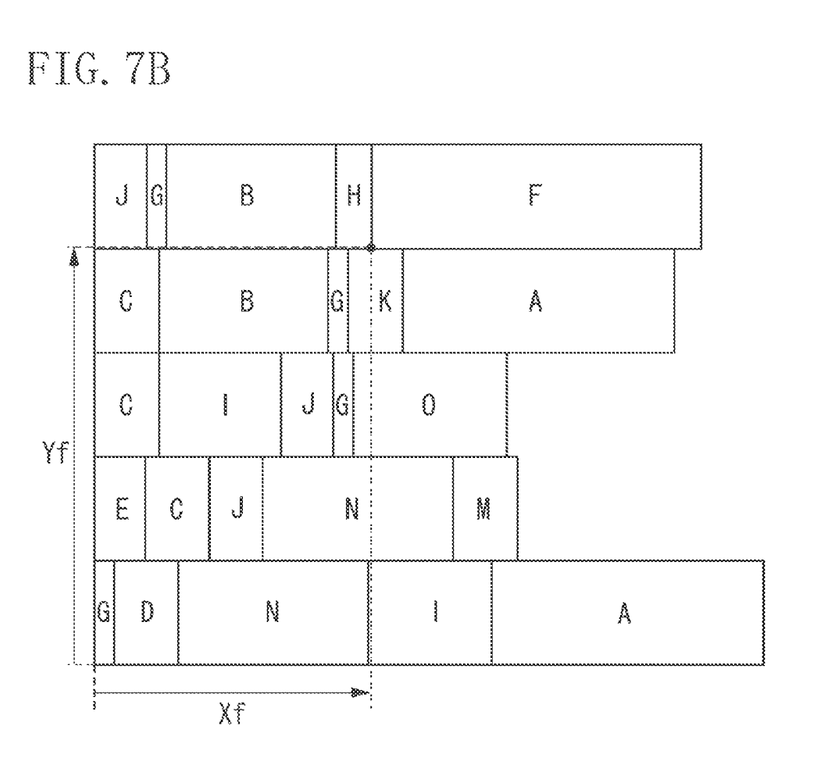

Subsequently, in step S107, the computer creates the layout of the entire surface of the mask from the net list and graphic information of the fifteen standard cells. In the present example, the computer creates a mask pattern on the entire surface of the chip as illustrated in FIG. 7B. The alphabets A to O in FIG. 7B indicate the respective cells, and the respective cells are adjacently arranged. Generally, layout coordinates of each cell can be easily output from the placement and routing tool. For example, supposing that an origin point is a lower left side of the cells, a reference point of the cell F is expressed as (Xf, Yf). Further, regarding a focused pattern inside the cell, coordinates of a pattern element in the cell are expressed as (X1, Y1) as illustrated in FIG. 7A, and this information is included in a set of information pieces in the standard cell library. One or more chips can be arranged on the entire surface of the mask.

Subsequently, in step S108, the computer performs the OPC on the layout of the entire surface of the mask. The line width and the coordinates of the central position are set as variables of each of the cut patterns. The computer carries out an optical simulation under the annular illumination corresponding to the NA of 1.35, the external σ of 0.85, and the annular ratio of 0.5, and corrects the variables so as to minimize a line width error and a positional shift error between the optical image and the target values in best focus.

Now, a method for carrying out the lithography verification on a critical pattern will be described below. Coordinates (X, Y) of the focused critical pattern can be identified as X=Xf+X1 and Y=Yf+Y1, using the coordinates (Xf, Yf) at which the critical cell containing the critical pattern is placed in the mask, and the coordinates (X1, Y1) of the focused critical pattern in the cell. Coordinates of another critical pattern can be also identified in a similar manner. A database of all of critical patterns can be constructed by performing this calculation over the entire surface of the mask. In step S109, the computer evaluates optical images of these critical patterns. Regarding a range for which the optical image is calculated, the computer carries out the lithography verification while adding a region of K·λ/NA (2≤K≤20) surrounding the focused critical pattern to a region to be calculated by the simulator, in consideration of the influence of the optical proximity effect of the pattern. The value of the constant K varies depending on the dimension of the focused pattern, required accuracy, and the like. The computer repeats the simulation while sequentially changing the region, thereby carrying out the lithography verification on the critical patterns. The computer uses the same evaluation index as the evaluation index when the mask variables of the standard cells and the variables of the illumination are optimized, as the evaluation index at this time. The region may be set in such a manner that a plurality of critical patterns is contained in a same calculation region, so that the calculation area of the focused critical pattern can be efficiently set. Further, the lithography verification may be carried out by repeating a simulation including a critical cell and its vicinity.

In this manner, according to the present exemplary embodiment, it is possible to reduce the number of patterns to be verified by the lithography verification in the entire surface of the mask, thereby efficiently carrying out the lithography verification on the entire mask. In other words, it is possible to provide the method for evaluating an optical image of a pattern that is capable of carrying out the lithography verification in a shorter time.

Next, a second exemplary embodiment of the present invention will be described. According to the first exemplary embodiment, the imaging characteristic of the pattern of each cell is evaluated, and then a critical pattern is identified. Once a critical pattern is identified, a position of the critical pattern is stored in the memory. Therefore, at the next time that a pattern of a mask is created using the same cell, the lithography verification can be carried out by only using the stored position of the critical pattern, and steps S103, 104, and 105 can be omitted.

First, the computer performs steps S101 to S111 in a similar manner to the first exemplary embodiment, thereby identifying a critical pattern and creating a pattern of a first mask. Subsequently, the computer adjacently arranges a plurality of cells including the identified critical pattern, thereby creating a pattern of a second mask different from the pattern of the first mask. Then, the computer carries out the lithography verification by reading out the position of the critical pattern stored in the memory, extracting a position of the identified critical pattern in the pattern of the second mask, and calculating an optical image of the critical pattern. The computer locates the position of the critical pattern in the second mask using a position of the cell in the mask and the position of the critical pattern in the cell.

In this manner, when a pattern of another mask is created, it is possible to share the information about the critical cell and the critical pattern of the standard cells if a common standard cell library is used between similar wafer processes. This can eliminate the processes of steps S103 to 105 to further reduce the calculation time, thereby allowing the lithography verification to be carried out on the pattern of the mask in a short time. On the other hand, the method discussed in U.S. Pat. No. 7,886,243 includes the check according to the geometric design rules every time a chip (a mask) is newly designed.

In this manner, the data of the mask pattern created by performing the steps as far as step S111 is converted according to a format of data to be input into a mask manufacturing apparatus (a drawing apparatus), and this converted data is input into the mask manufacturing apparatus. Then, the mask manufacturing apparatus draws the pattern on a mask blank based on the input data to manufacture the mask. The manufactured mask is introduced into the projection exposure apparatus. The projection exposure apparatus illuminates the manufactured mask under a set exposure condition, projects an image of the pattern of the mask onto a photosensitive material (a resist) on the substrate, and exposes the photosensitive material. If the exposure apparatus is the electron beam exposure apparatus, the exposure process can be performed by controlling a position of an electron beam and blanking using the data of the created mask pattern, and transferring the pattern onto the substrate by an exposure.

Next, an exemplary embodiment of a method for manufacturing a device using the above-described exposure apparatus will be described. The device is manufactured by performing a process of mounting the mask manufactured in the above-described manner on the exposure apparatus and transferring the pattern of the mask onto the substrate coated with the photosensitive material by an exposure, a process of developing the substrate exposed by the exposure process, and other known processes. The device can be a semiconductor integrated circuit element, a liquid crystal display element, and the like. The substrate can be a wafer, a glass plate, and the like. Examples of the known processes include respective processes of oxidation, a film formation, deposition, doping, planarization, etching, a resist removal, dicing, bonding, and packaging.

Having described exemplary embodiments of the present invention, it should be apparent that the present invention is not limited to these exemplary embodiments, and can be modified and changed in various manners within the scope of the invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-267159 filed Dec. 25, 2013, which is hereby incorporated by reference herein in its entirety.

What is claimed is:

1. A method performed by a processor comprising:
acquiring data of patterns of a single cell from a plurality of cells, wherein an evaluation value of an optical image of the single cell is calculated and an identified pattern is identified for which the calculated evaluation value falls outside a first allowable range among the patterns of the single cell;
creating a pattern of a mask used for a transferring method, by arranging the patterns of the plurality of cells that include the identified pattern;
extracting a portion in the created pattern of the mask based on the identified pattern; and
evaluating an optical image of a pattern in the portion,
wherein the transferring method comprises transferring the pattern of the mask onto a substrate.

2. The method according to claim 1, further comprising correcting a pattern for which the evaluation value falls outside a second allowable range, among the identified pattern.

3. The method according to claim 2, wherein the second allowable range is wider than the first allowable range.

4. The method according to claim 1, further comprising storing a position of the identified pattern into a storage unit.

5. The method according to claim 4, wherein the evaluating includes obtaining a position of the identified pattern using a position of the cell and the stored position of the identified pattern, and evaluating an optical image of a pattern in a region containing the obtained position.

6. The method according to claim 1, wherein the plurality of cells contains patterns, each of which is the identified pattern, different from one another depending on respective cells.

7. The method according to claim 1, further comprising:
creating a pattern of a first mask by arranging the patterns of the plurality of cells that include the identified pattern;
evaluating an optical image of the identified pattern of the first mask;
creating a pattern of a second mask different from the pattern of the first mask by arranging the patterns of the plurality of cells; and
evaluating an optical image of the identified pattern of the second mask.

8. The method according to claim 1, further comprising performing an optical proximity effect correction on the pattern of the single cell alone before the calculating,
wherein the calculating includes calculating the evaluation value of the optical image of the pattern corrected by the optical proximity effect correction.

9. The method according to claim 1, wherein the pattern of the cell is a pattern including a pattern element for cutting or connecting a line and space pattern.

10. A non-transitory recording medium recording a program which causes a computer to execute processing of the method comprising:
acquiring data of patterns of a single cell from a plurality of cells, wherein an evaluation value of an optical image of the single cell is calculated and an identified pattern is identified for which the calculated evaluation value falls outside a first allowable range among the patterns of the single cell;
creating a pattern of a mask used for a transferring method, by arranging the patterns of the plurality of cells that include the identified pattern;
extracting a portion in the created pattern of the mask based on the identified pattern; and
evaluating an optical image of a pattern in the portion,
wherein the transferring method comprises transferring the pattern of the mask onto a substrate.

11. The non-transitory recording medium according to claim 10, further comprising correcting a pattern for which the evaluation value falls outside a second allowable range, among the identified pattern.

12. The non-transitory recording medium according to claim 10, wherein the plurality of cells contains patterns, each of which is the identified pattern, different from one another depending on respective cells.

13. The non-transitory recording medium according to claim 10, further comprising:
creating a pattern of a first mask by arranging the patterns of the plurality of cells that include the identified pattern;
evaluating an optical image of the identified pattern of the first mask;
creating a pattern of a second mask different from the pattern of the first mask by arranging the patterns of the plurality of cells; and
evaluating an optical image of the identified pattern of the second mask.

14. An apparatus configured to perform the method comprising:
acquiring data of patterns of a single cell from a plurality of cells, wherein an evaluation value of an optical image of the single cell is calculated and an identified pattern is identified for which the calculated evaluation value falls outside a first allowable range among the patterns of the single cell;
creating a pattern of a mask used for a transferring method, by arranging the patterns of the plurality of cells that include the identified pattern;
extracting a portion in the created pattern of the mask based on the identified pattern; and
evaluating an optical image of a pattern in the portion,
wherein the transferring method comprises transferring the pattern of the mask onto a substrate.

15. The apparatus according to claim 14, wherein the method further comprises correcting a pattern for which the evaluation value falls outside a second allowable range, among the identified pattern.

16. The apparatus according to claim 14, wherein the plurality of cells contains patterns, each of which is the identified pattern, different from one another depending on respective cells.

17. The apparatus according to claim 14, wherein in the method further comprises:
creating a pattern of a first mask by arranging the patterns of the plurality of cells that include the identified pattern;
evaluating an optical image of the identified pattern of the first mask;
creating a pattern of a second mask different from the pattern of the first mask by arranging the patterns of the plurality of cells; and
evaluating an optical image of the identified pattern of the second mask.

* * * * *